(12) United States Patent
Campbell et al.

(10) Patent No.: US 7,283,358 B2
(45) Date of Patent: Oct. 16, 2007

(54) APPARATUS AND METHOD FOR FACILITATING COOLING OF AN ELECTRONICS RACK BY MIXING COOLER AIR FLOW WITH RE-CIRCULATING AIR FLOW IN A RE-CIRCULATION REGION

(75) Inventors: Levi A. Campbell, New Paltz, NY (US); Ricahrd C. Chu, Hopewell Junction, NY (US); Michael J. Ellsworth, Jr., Lagrangeville, NY (US); Madhusudan K. Iyengar, Rhinebeck, NY (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 220 days.

(21) Appl. No.: 11/184,524

(22) Filed: Jul. 19, 2005

(65) Prior Publication Data

US 2007/0019380 A1    Jan. 25, 2007

(51) Int. Cl.
*H05K 7/20* (2006.01)
(52) U.S. Cl. .................. 361/694; 361/695; 361/696; 454/184
(58) Field of Classification Search ............. 361/687, 361/694–696; 454/184
See application file for complete search history.

(56) References Cited

U.S. PATENT DOCUMENTS

| 4,774,631 A | 9/1988 | Okuyama et al. ........... 361/384 |
| 4,949,218 A | 8/1990 | Blanchard et al. .......... 361/384 |
| 5,136,464 A | 8/1992 | Ohmori ...................... 361/384 |
| 5,467,250 A * | 11/1995 | Howard et al. ............. 361/696 |
| 5,467,609 A * | 11/1995 | Feeney ...................... 62/259.2 |
| 5,513,071 A | 4/1996 | La Violette et al. ........ 361/703 |
| 6,053,808 A | 4/2000 | Koradia et al. ............. 454/184 |
| 6,317,320 B1 | 11/2001 | Cosley et al. ............... 361/695 |
| 6,574,970 B2 * | 6/2003 | Spinazzola et al. ............ 62/89 |
| 6,672,955 B2 | 1/2004 | Charron ..................... 454/184 |
| 6,819,563 B1 | 11/2004 | Chu et al. ................... 361/696 |
| 7,170,745 B2 * | 1/2007 | Bash et al. ................. 361/695 |
| 2004/0217072 A1 | 11/2004 | Bash et al. .................. 211/26 |
| 2004/0257766 A1 | 12/2004 | Rasmussen et al. ........ 361/689 |
| 2005/0170770 A1* | 8/2005 | Johnson et al. ............. 454/184 |

OTHER PUBLICATIONS

Campbell et al., "Apparatus and Method for Facilitating Cooling of an Electronics Rack Employing a Closed Loop Heat Exchange System," U.S. Appl. No. 11/124,525, filed May 6, 2005.

* cited by examiner

*Primary Examiner*—Gregory D Thompson
(74) *Attorney, Agent, or Firm*—Lily Neff, Esq.; Kevin P. Radigan, Esq.; Heslin Rothenberg Farley & Mesiti, P.C.

(57) ABSTRACT

Apparatus and method are provided for facilitating cooling of an electronics rack employing an air delivery structure coupled to the electronics rack. The air delivery structure delivers air flow at a location external to the electronics rack and in a direction to facilitate mixing thereof with re-circulating exhausted inlet-to-outlet air flow from the air outlet side of the electronics rack to the air inlet side thereof. The delivered air flow is cooler than the re-circulating exhausted inlet-to-outlet air flow and when mixed with the re-circulating air flow facilitates lowering air inlet temperature at a portion of the air inlet side of the electronics rack, thereby enhancing cooling of the electronics rack.

10 Claims, 10 Drawing Sheets

APPARATUS AND METHOD FOR FACILITATING COOLING OF AN ELECTRONICS RACK BY MIXING COOLER AIR FLOW WITH RE-CIRCULATING AIR FLOW IN A RE-CIRCULATION REGION

CROSS-REFERENCE TO RELATED APPLICATION

This application contains subject matter which is related to the subject matter of the following U.S. patent application, which is assigned to the same assignee as this application and which is hereby incorporated herein by reference in its entirety:

"Apparatus and Method for Facilitating Cooling of an Electronics Rack Employing a Closed Loop Heat Exchange System", by Campbell et al., Ser. No. 11/124,525, filed May 6, 2005.

TECHNICAL FIELD

The present invention relates in general to apparatuses and methods for facilitating cooling of rack-mounted assemblages of individual electronics units, such as rack-mounted computer server units.

BACKGROUND OF THE INVENTION

The power dissipation of integrated circuit chips, and the modules containing the chips, continues to increase in order to achieve increases in processor performance. This trend poses a cooling challenge at both the module and system level. Increased air flow rates are needed to effectively cool high power modules and to limit the temperature of the air that is exhausted into the computer center.

In many large server applications, processors along with their associated electronics (e.g., memory, disk drives, power, etc.) are packaged in removable drawer configurations stacked within a rack or frame. In other cases, the electronics may be in fixed locations within the rack or frame. Typically, the components are cooled by air moving in parallel air flow paths, usually front-to-back, impelled by one or more air moving devices (e.g., fans or blowers). In some cases it may be possible to handle increased power dissipation within a single drawer by providing greater air flow, through the use of a more powerful air moving device or by increasing the rotational speed (i.e., RPMs) of an existing air moving device. However, this approach is becoming problematic at the rack level in the context of a computer installation (e.g., data center).

The sensible heat load carried by the air exiting the rack is stressing the ability of the room air conditioning to effectively handle the load. This is especially true for large installations with "server farms" or large banks of computer racks close together. In such installations, not only will the room air conditioning be challenged, but the situation may also result in re-circulation problems with some fraction of the "hot" air exiting one rack unit being drawn into the air inlet of the same rack or a nearby rack. This re-circulating flow is often extremely complex in nature, and can lead to significantly higher rack inlet temperatures than expected. This increase in cooling air temperature may result in components exceeding their allowable operating temperature or in a reduction in long term reliability of the components.

Thus, there is a need in the art for an apparatus and method for facilitating balanced cooling of rack-mounted electronic units, particularly in the context of a large computer installation.

SUMMARY OF THE INVENTION

The shortcomings of the prior art are overcome and additional advantages are provided through an apparatus for facilitating cooling of an electronics rack. The apparatus includes an outlet door configured to mount to and at least partially cover an air outlet side of an electronics rack. The outlet door includes a first section and a second section. The first and second sections of the door are configured to re-direct at least a portion of exiting inlet-to-outlet air flow of the electronics rack, and to exhaust the re-directed air flow from the outlet door at a location and in a direction to facilitate mixing thereof with re-circulating exhausted inlet-to-outlet air flow from the air outlet side of the electronics rack to an air inlet side thereof. Mixing of the re-directed air flow and the re-circulating air flow facilitates lowering air inlet temperature at a portion of the air inlet side of the electronics rack, thereby enhancing cooling of the electronics rack. This is accomplished by selecting the re-directed air flow to be cooler than the re-circulating air flow.

In another aspect, a cooled electronics system is provided. The cooled electronics system includes an electronics rack having an air inlet side and an air outlet side, at least one electronics drawer, and at least one air moving device. The air inlet and air outlet sides respectively enable ingress of external air at the inlet and egress of heated air at the exit, while the at least one air moving device is capable of causing external air to flow from the air inlet side of the electronics rack across the at least one electronics drawer to the air outlet side of the electronics rack. The cooled electronics system further includes an apparatus coupled to the electronics rack for facilitating cooling of the electronics rack. The apparatus includes an air delivery structure coupled to the electronics rack for delivering air flow at a location external to the electronics rack and in a direction to facilitate mixing thereof with any re-circulating exhausted inlet-to-outlet air flow from the air outlet side of the electronics rack to the air inlet side thereof, wherein the delivered air flow is cooler than the re-circulating exhausted inlet-to-outlet air flow, and wherein mixing of the delivered air flow and the re-circulating air flow facilitates a lower air inlet temperature at a portion of the air inlet side of the electronics rack, thereby enhancing cooling of the electronics rack.

In a further aspect, a method for facilitating cooling of an electronics rack is provided. The method includes: allowing inlet-to-outlet air flow through an electronics rack from an air inlet side to an air outlet side thereof; and employing an apparatus coupled to the electronics rack to facilitate delivering air flow at a location external to the electronics rack and in a direction to facilitate mixing thereof with any re-circulating exhausted inlet-to-outlet air flow from the air outlet side of the electronics rack to the air inlet side thereof. The delivered air flow is cooler than the re-circulating exhausted inlet-to-outlet air flow, and mixing of the delivered air flow and the re-circulating air flow facilitates a lower air inlet temperature at a portion of the air inlet side of the electronics rack, thereby enhancing cooling of the electronics rack.

Further, additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

BEST MODE FOR CARRYING OUT THE INVENTION

As used herein, the terms "electronics rack", "rack-mounted electronic equipment", and "rack unit" are used interchangeably, and include any housing, frame, rack, compartment, blade server system, etc., having one or more heat generating components of a computer system or electronics system, and may be, for example, a stand alone computer processor having high, mid or low end processing capability. In one embodiment, an electronics rack may comprise multiple electronics drawers each having one or more heat generating components disposed therein requiring cooling. Further, as used herein, "heat exchanger" means any heat exchange mechanism through which coolant can circulate; and includes, one or more discrete heat exchange devices coupled either in series or in parallel.

Reference is now made to the drawings, which are not drawn to scale for reasons of understanding, wherein the same reference numbers used throughout different figures designate the same or similar components.

Figure 1A:
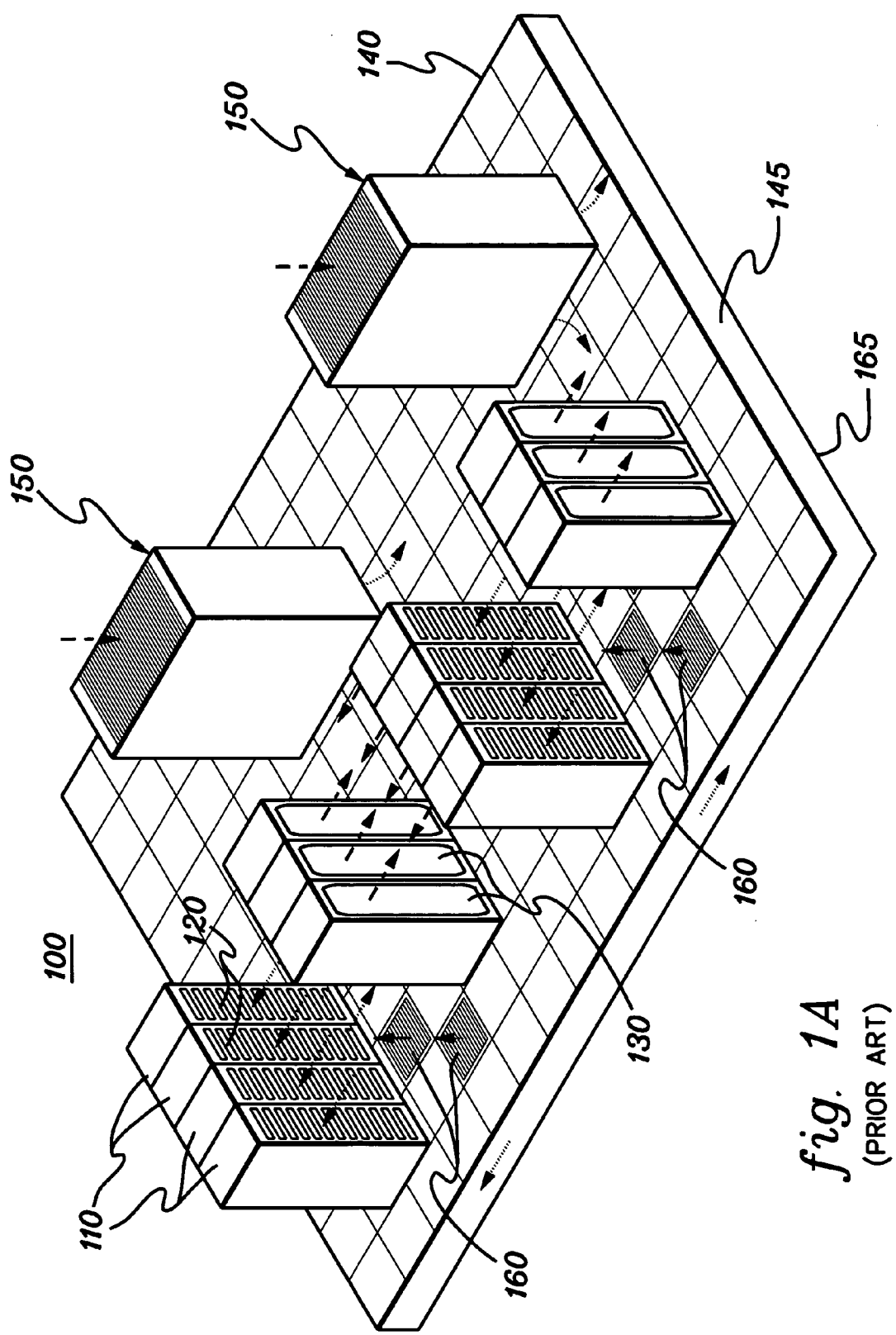
FIG. 1A depicts one embodiment of a conventional raised floor layout of an air cooled computer installation.

As shown in FIG. 1A, in a raised floor layout of an air cooled computer installation 100 typical in the prior art, multiple electronics racks 110 are disposed in one or more rows. A computer installation such as depicted in FIG. 1A may house several hundred, or even several thousand microprocessors. In the arrangement of FIG. 1A, chilled air enters the computer room via perforated floor tiles 160 from a supply air plenum 145 defined between the raised floor 140 and a base or sub-floor 165 of the room. Cooled air is taken in through louvered covers at air inlet sides 120 of the electronics racks and expelled through the back (i.e., air outlet sides 130) of the electronics racks. Each electronics rack 110 may have an air moving device (e.g., fan or blower) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more conditioned air units 150, also disposed within the computer installation 100. Room air is taken into each conditioned air unit 150 near an upper portion thereof. This room air comprises in part exhausted air from the "hot" aisles of the computer installation defined by opposing air outlet sides 130 of the electronics racks 110.

Figure 1B:
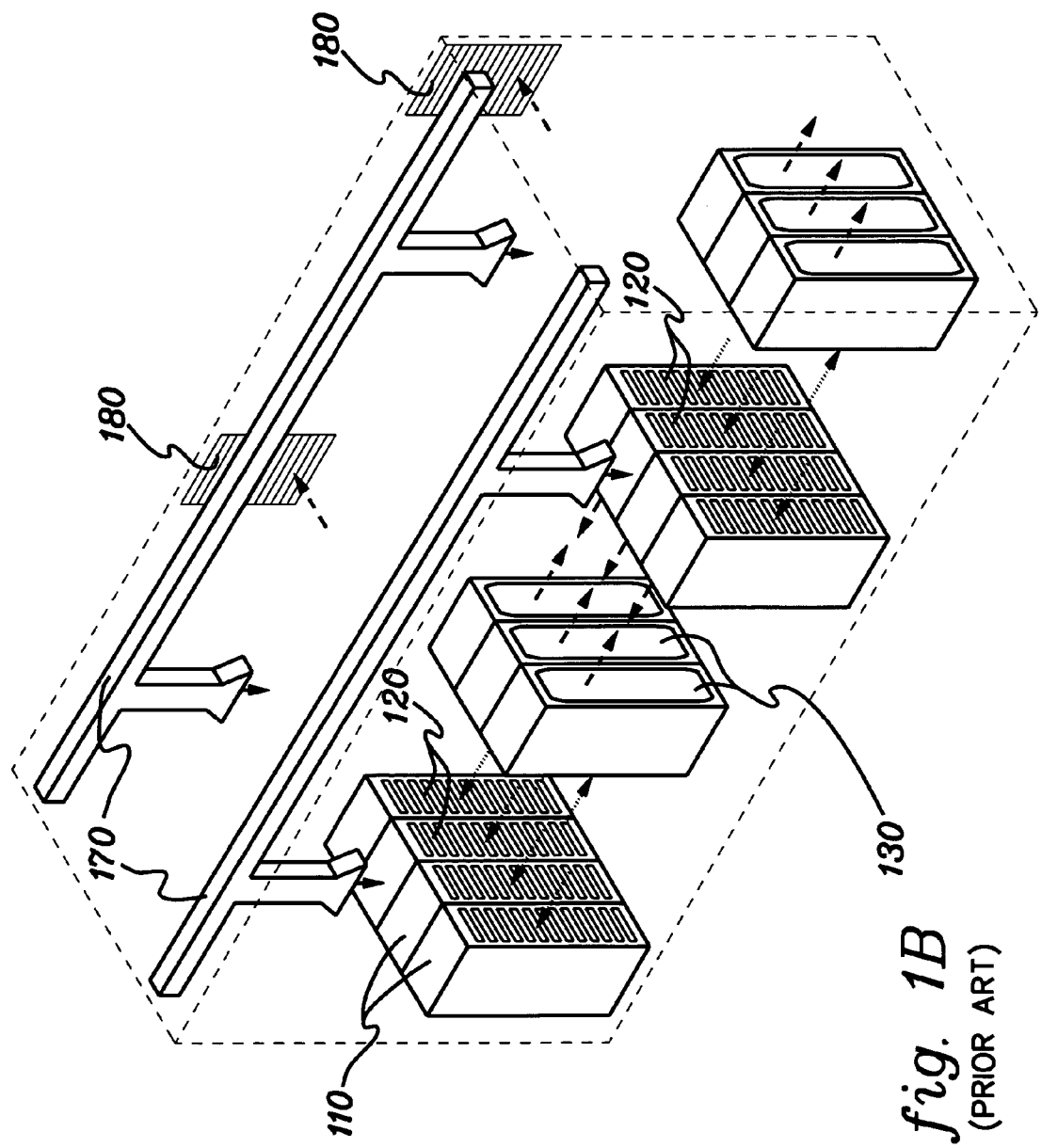
FIG. 1B depicts one embodiment of a conventional non-raised floor layout of an air cooled computer installation, wherein overhead air ducts and diffusers are employed in distributing cooled air flow to the electronics racks.

FIG. 1B depicts an alternate computer room configuration wherein multiple electronics racks 110 disposed in rows are cooled via conditioned and cooled air entering the room from overhead ducts and diffusers 170. Air exits the room via vents 180 that may be placed at different locations within the room. The ducts and diffusers 170 are disposed so as to align to the cold aisle of the multiple rows and provide cooled air to the air inlet sides 120 of the electronics racks. Air moving devices within the racks move the cooled air through the racks from their inlet-to-outlet sides to cool the heat generating components therein. Heated air is again exhausted at the hot aisles of the racks through the air outlet sides 130 of electronics racks 110. In one embodiment, returns 180 can be aligned to the hot aisles defined by the opposing air exhaust sides 130 of the electronics racks.

Figure 2:
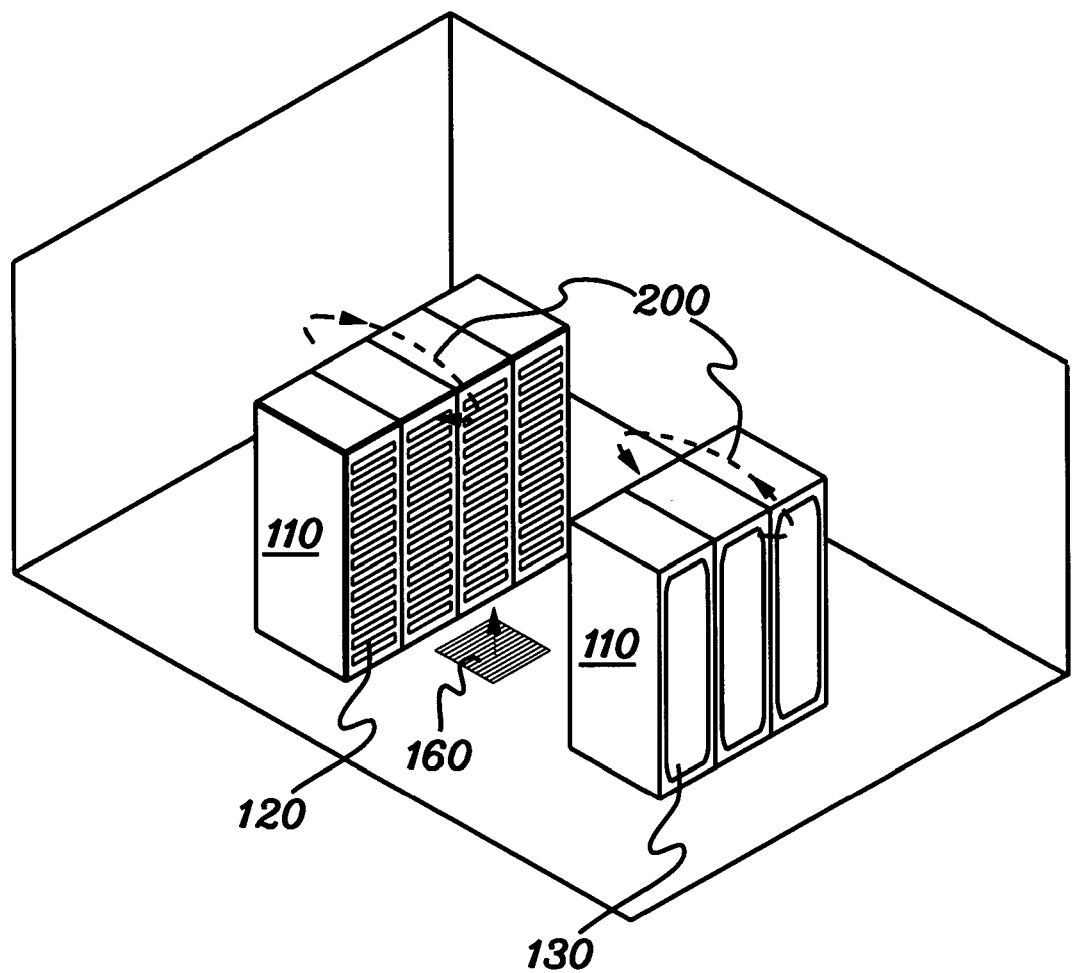
FIG. 2 depicts one problem addressed by the present invention, showing re-circulation air flow patterns in one implementation of a raised floor layout of an air cooled computer installation.

Due to the ever increasing air flow requirements through electronics racks, and limits of air distribution within the typical computer room installation, re-circulation problems within the room may occur. This is shown in FIG. 2 for a raised floor layout, wherein hot air re-circulation 200 occurs from the air outlet sides 130 of the electronics racks back to the cold air aisle defined by the opposing air inlet sides 120 of the electronics rack. This re-circulation can occur because the conditioned air supplied through tiles 160 is typically only a fraction of the air flow rate forced through the electronics racks by the air moving devices disposed therein. This can be due, for example, to limitations on the tile sizes (or diffuser flow rates). The remaining fraction of the supply of inlet side air is often made up by ambient room air through re-circulation 200. This re-circulating flow is often very complex in nature, and can lead to significantly higher rack unit inlet temperatures than desired.

The re-circulation of hot exhaust air from the hot aisle of the computer room installation to the cold aisle can be detrimental to the performance and reliability of the computer system(s) or electronic system(s) within the racks. Data center equipment is typically designed to operate with rack air inlet temperatures in the 10-35° C. range. For a raised floor layout such as depicted in FIG. 1A, however, temperatures can range from 15-20° C. at the lower portion of the rack, close to the cooled air input floor vents, to as much as 45-50° C. at the upper portion of the electronics rack, where the hot air can form a self-sustaining re-circulation loop. Since the allowable rack heat load is limited by the rack inlet air temperature at the "hot" part, this temperature distribution correlates to an inefficient utilization of available chilled air. Also, computer installation equipment almost always represents a high capital investment to the customer. Thus, it is of significant importance, from a product reliability and performance view point, and from a customer satisfaction and business perspective, to limit the temperature of the inlet air to the rack unit to be within a desirable range, i.e., from a lower portion of the air inlet side to an upper portion of the air inlet side. The efficient cooling of such computer and electronic systems, and the amelioration of localized hot air inlet temperatures to one or more rack units due to re-circulation of air currents, are addressed by the apparatuses and methods disclosed herein.

Figure 3A:
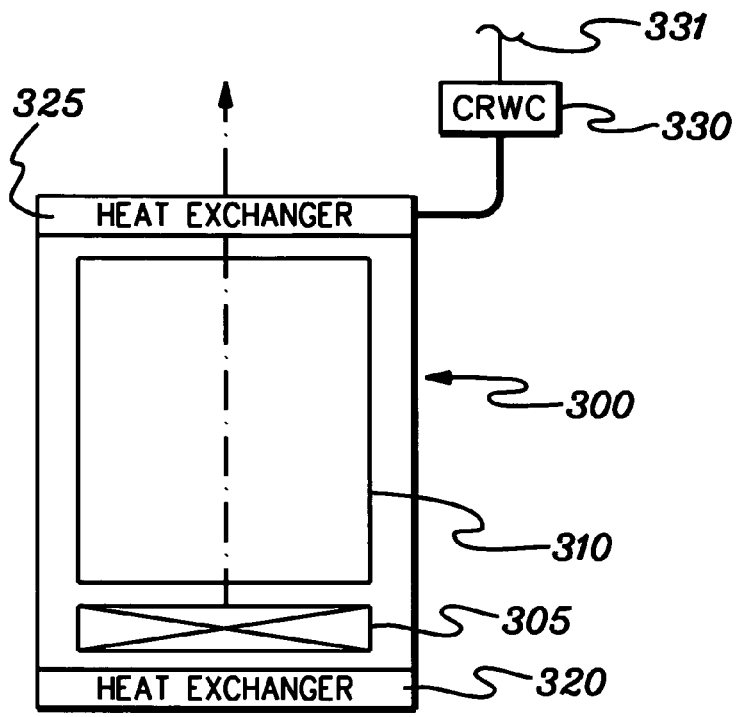
FIG. 3A is a cross-sectional plan view of one embodiment of electronics rack using facility chilled liquid-to-air heat exchangers to enhance cooling of air passing through the electronics rack.
Figure 3B:
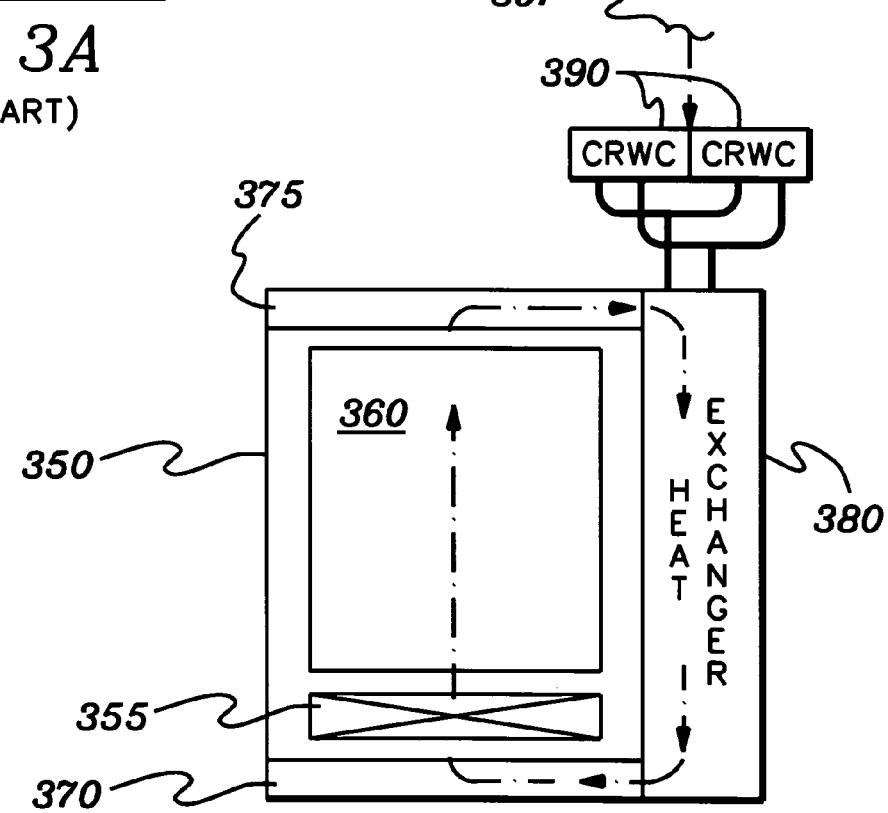
FIG. 3B is a cross-sectional plan view of another embodiment of an electronics rack using facility chilled liquid-to-air heat exchangers to enhance cooling of air passing though the electronics racks.

FIGS. 3A and 3B depict prior rack level water cooled solutions which utilize chilled facility water to remove heat from the computer installation room, thereby transferring the cooling burden from the air-conditioning units to the building chilled water coolers. The embodiment of FIG. 3A is described in detail in commonly assigned U.S. Pat. No. 6,819,563, while the embodiment of FIG. 3B is described in detail in commonly assigned U.S. Pat. No. 6,775,137, both of which are incorporated herein by reference in their entirety. Briefly summarized, both embodiments utilize a computer room water conditioning unit 330 (FIG. 3A), 390 (FIG. 3B) (fed with facility chilled water 331 (FIG. 3A), 391 (FIG. 3B)), which circulates chilled coolant through one or more heat exchangers coupled to individual electronics racks 300, 350 within the computer room.

In the embodiment of FIG. 3A, electronics rack 300 has an inlet heat exchanger 320 and/or an outlet heat exchanger 325 coupled to the rack. Air flow across one or more electronics drawers 310 is forced via one or more air moving devices 305. Each heat exchanger 320, 325 covers the complete air flow paths from front to back, with the air intake being chilled by heat exchanger 320, and the heated exhaust chilled by heat exchanger 325. Thus, the inlet-to-outlet air flow paths through the rack unit each pass through the same sequence of heat exchangers.

In FIG. 3B, rack unit 350 again includes one or more air moving devices 355 for moving air flow from an air inlet side to an air outlet side across one or more drawer units 360 containing the heat generating components. In this embodiment, a front cover 370 covers the air inlet side, a back cover covers the air outlet side of the rack unit, and a side car includes a heat exchanger 380 for cooling of the air circulating through the rack unit. Further, in this embodiment, multiple computer room water conditioning (CRWC) units 390 receive building or facility chilled water 391, which is then used to cool coolant circulating through heat exchanger 380. The rack unit in this example is assumed to comprise a substantially enclosed housing wherein the same air circulates through the housing and passes across the heat exchanger 380.

Note that the cooling techniques illustrated in FIGS. 3A and 3B, and described in the above-referenced United States Letters Patent, each utilize utility or building chilled water. There are many "dry" data centers that do not have access to building chilled water for the purpose of computer system cooling. Further, the techniques depicted in FIGS. 3A and 3B do not explicitly address the problem of localized over heating of the air temperature at the inlet of the rack unit. The present invention, in one aspect, solves this problem of localized air over heating, and is particularly beneficial where building chilled water is not available for facilitating cooling of the electronics racks. The concepts disclosed herein can be used in place of devices such as shown in FIGS. 3A and 3B, where there occurs a large air temperature differential between different portions of the air inlet side of the electronics rack. Further, the concepts disclosed herein lead to energy gains by more efficiently using the chilled conditioned air commonly used in today's air cooled data centers.

Figure 4:
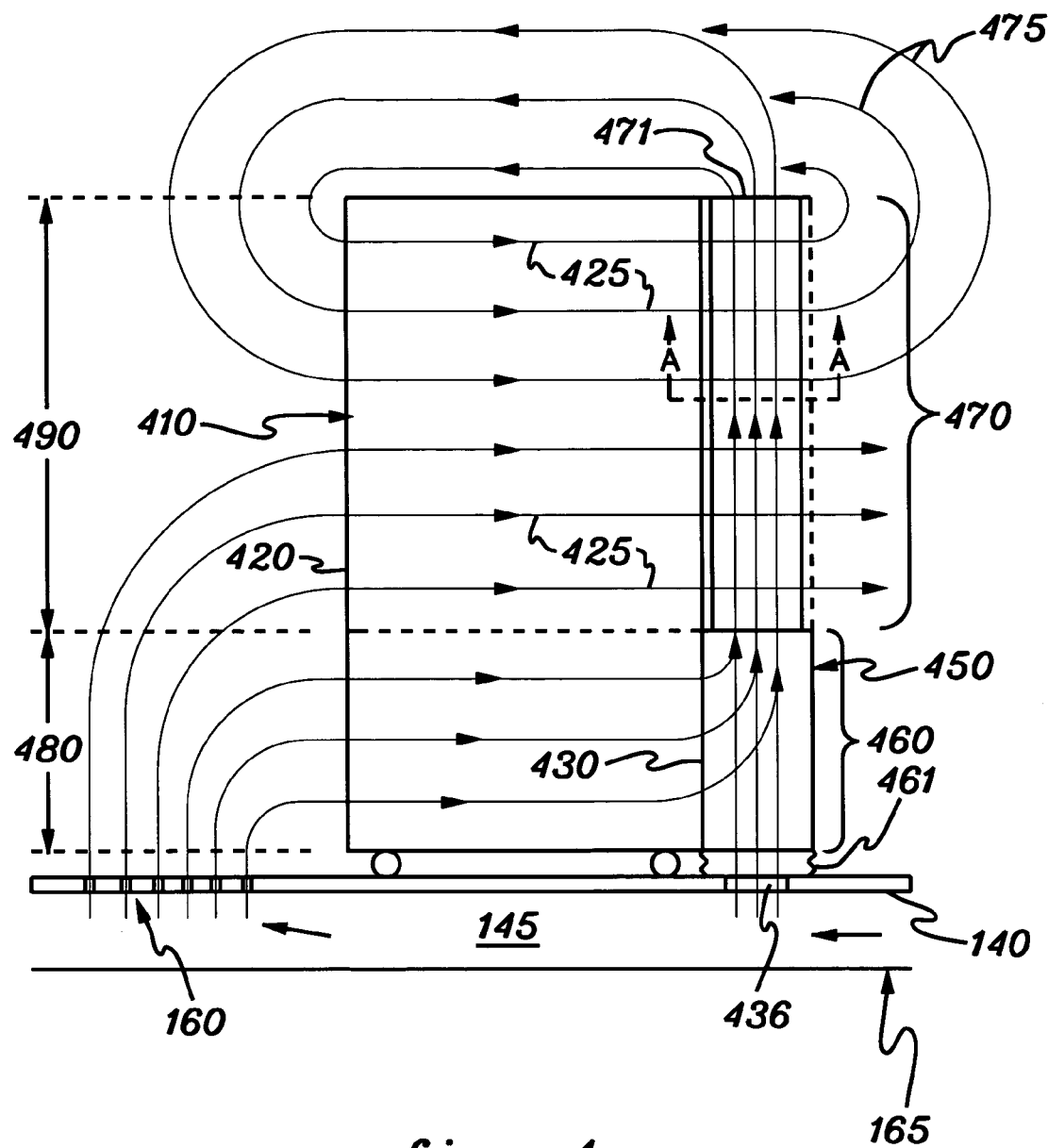
FIG. 4 depicts one embodiment of an electronics rack disposed on a raised floor of a computer installation, and employing an apparatus including an outlet door coupled to the electronics rack for facilitating cooling thereof, in accordance with an aspect of the present invention.

FIG. 4 depicts one embodiment of an air cooled computer installation wherein an electronics rack 410 resides on a raised floor 140. Cooled air enters the computer room via floor vents 160 from a supply air plenum 145 defined between raised floor 140 and a base or sub-floor 165 of the room. Cooled air is taken into the electronics rack 410 at an air inlet side thereof 420 and may be forced through the rack via one or more air moving devices (not shown) to an air outlet side 430 of the rack. As shown in FIG. 4, multiple, substantially horizontal, inlet-to-outlet air flow paths 425 are established through the electronics rack 410 from the air inlet side 420 to the air outlet side 430 thereof.

In this example, a percentage of the inlet-to-outlet air flow through the electronics rack at an upper portion thereof is re-circulated 475, and is drawn back into the electronics rack 410 at the upper portion thereof, this re-circulation of air flow near the upper portion of the electronics rack in the raised floor embodiment raises the temperature of the inlet-to-outlet air flow through the upper portion of the rack, thereby potentially adversely effecting performance of more or more components within the rack.

Figure 4A:
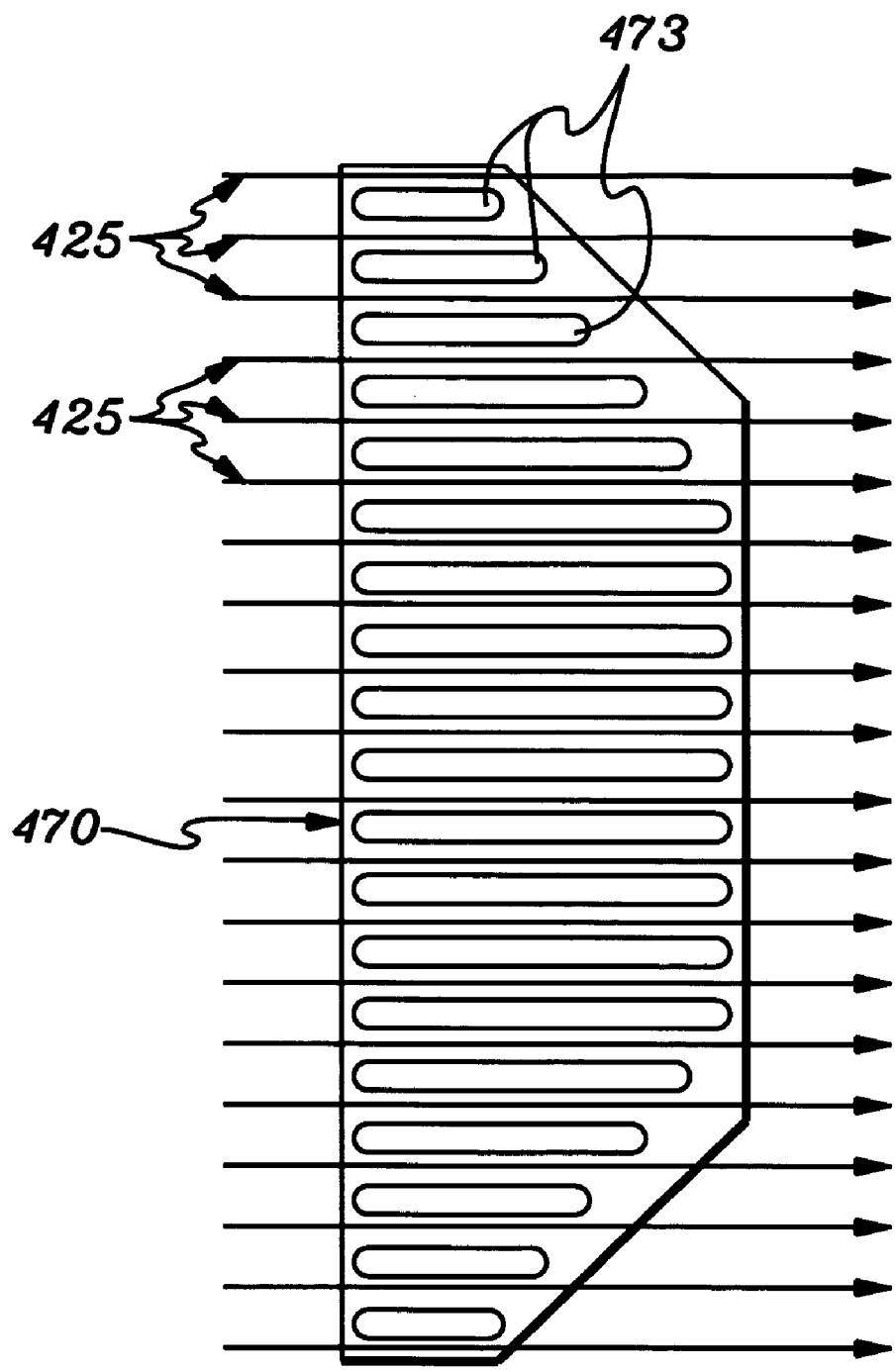
FIG. 4A is a cross-sectional plan view of the outlet door of FIG. 4 taken along line A-A, in accordance with an aspect of the present invention.

Thus, in accordance with an aspect of the present invention, an apparatus is provided which couples to the electronics rack and directs a cooler air flow into the re-circulating air flow 475 region to thereby reduce the air inlet temperature at the air inlet side of the electronics rack in the region of re-circulating air current. One embodiment of this concept is depicted in FIGS. 4 & 4A. In this embodiment, the apparatus comprises an outlet door 450, which has a first section 460 and a second section 470. By way of example, first section 460 is a lower section, while second section 470 is an upper section of the outlet door. Further, first section 460 aligns to a lower portion 480 of electronics rack 410, while second section 470 aligns to an upper portion 490 of electronics rack 410. In this example, first section 460 is configured to re-direct inlet-to-outlet air flow through the lower portion 480 of the electronics rack from a substantially horizontal pathway when departing from the air outlet side of the electronics rack to an orthogonal, vertical direction as shown in FIG. 4. This re-directed air flow passes through channels in the second section 470 of outlet door 450 and is expelled at an upper surface 471 at the re-circulation region and in a direction to facilitate mixing thereof with the re-circulating exhausted inlet-to-outlet air flow 475 to thereby reduce the temperature of the re-circulating air flow. This is achieved because the air taken in at the air inlet side of the electronics rack in lower portion 480 is cooler due to portion 480 being closer to the perforated floor tile 160 than the upper portion 490 of the electronics rack. Thus, the inlet-to-outlet air flow exiting the air outlet side of the electronics rack at the lower portion thereof is generally cooler then the air exiting from the upper portion of the electronics rack (i.e., assuming that there is a relatively equal distribution of heat generating components within the rack unit). By re-directing this exiting air from the lower portion to a location and a direction to mix with the re-circulating air flow 475, the temperature of the resultant re-circulated air flow at the upper portion of the air inlet side of the electronics rack is reduced.

To lower the temperature of the re-directed air flow, cooled air flow can also be introduced through an opening 436 in raised floor 140 and a corresponding opening in the bottom surface of the lower section of the outlet door. In this implementation, venting 461 is provided to insure that the cooled air supply from air supply plenum 145 is provided directly into the first section 460 of the outlet door, and hence becomes part of the re-directed air flow.

Upper section 470 of outlet door 450 is configured to facilitate orthogonal bidirectional air flow therethrough. This is shown in the cross-sectional view of FIG. 4A, which is taken along line A-A of FIG. 4. In this figure, the inlet-to-outlet air flow 425 through the upper portion 490 (see FIG. 4) of the electronics rack is depicted as passing between narrow channels 473 defined within the upper section of the outlet door. These channels can be defined by elongate enclosed ducts or tubes (for example, fabricated from plastic), that are also elongate in cross-section as shown to enhance passage of the re-directed air flow therethrough. In one implementation, the number and configuration of channels 473 within the second section of the outlet door are designed to minimize vertical flow pressure drop of the re-directed air flow from the lower portion of the electronics rack, as well as minimize horizontal flow pressure drop through the second section of the outlet door by the inlet-to-outlet air flow through the upper portion of the electronics rack.

Figures 5A, 5B:
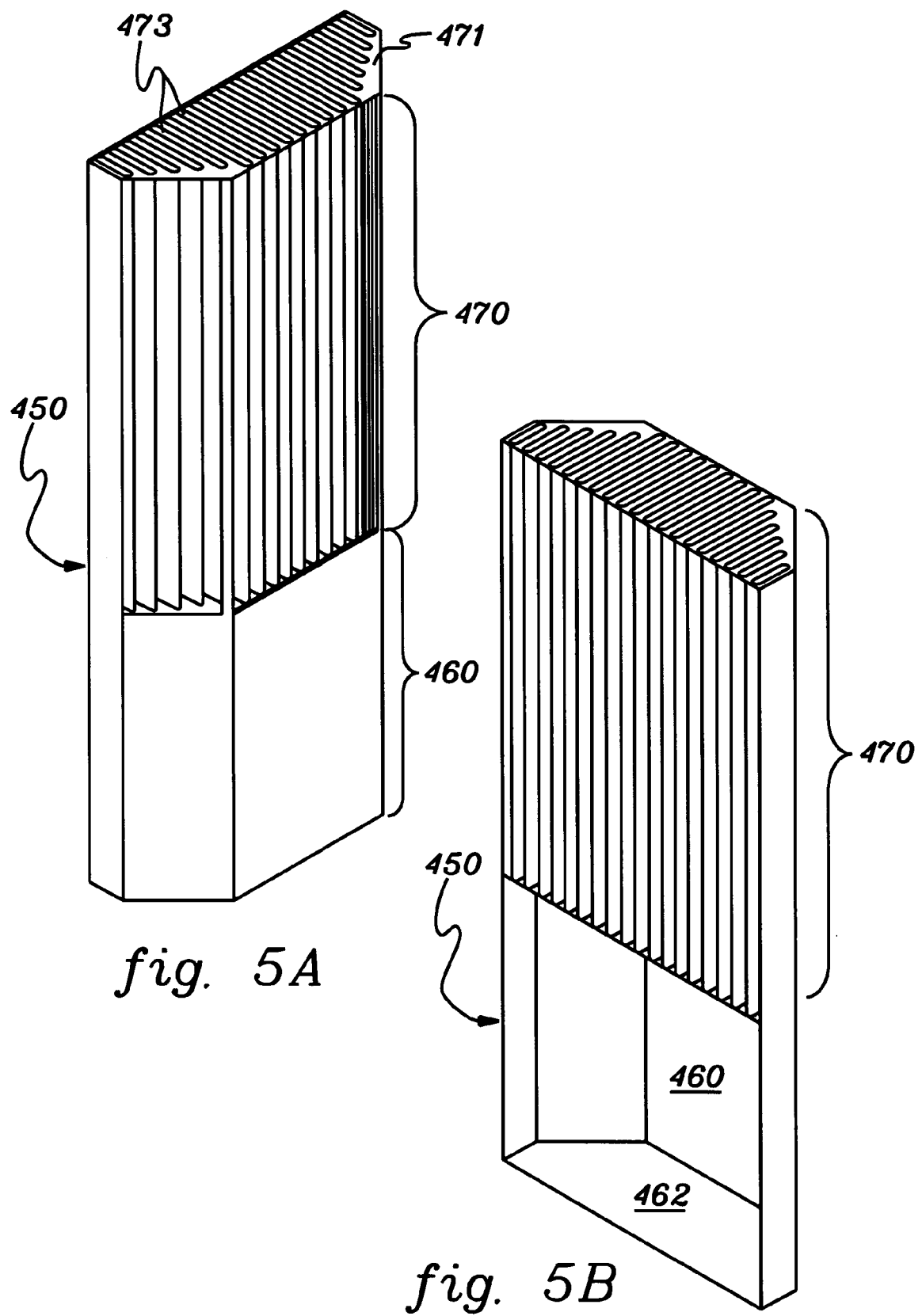
FIG. 5A is an isometric view of one embodiment of an outlet door configured to mount to and at least partially cover an air outlet side of an electronics rack, in accordance with an aspect of the present invention.
FIG. 5B is an isometric view of the outlet door of FIG. 5A, showing one embodiment of the inside of the outlet door, in accordance with an aspect of the present invention.
Figure 5C:
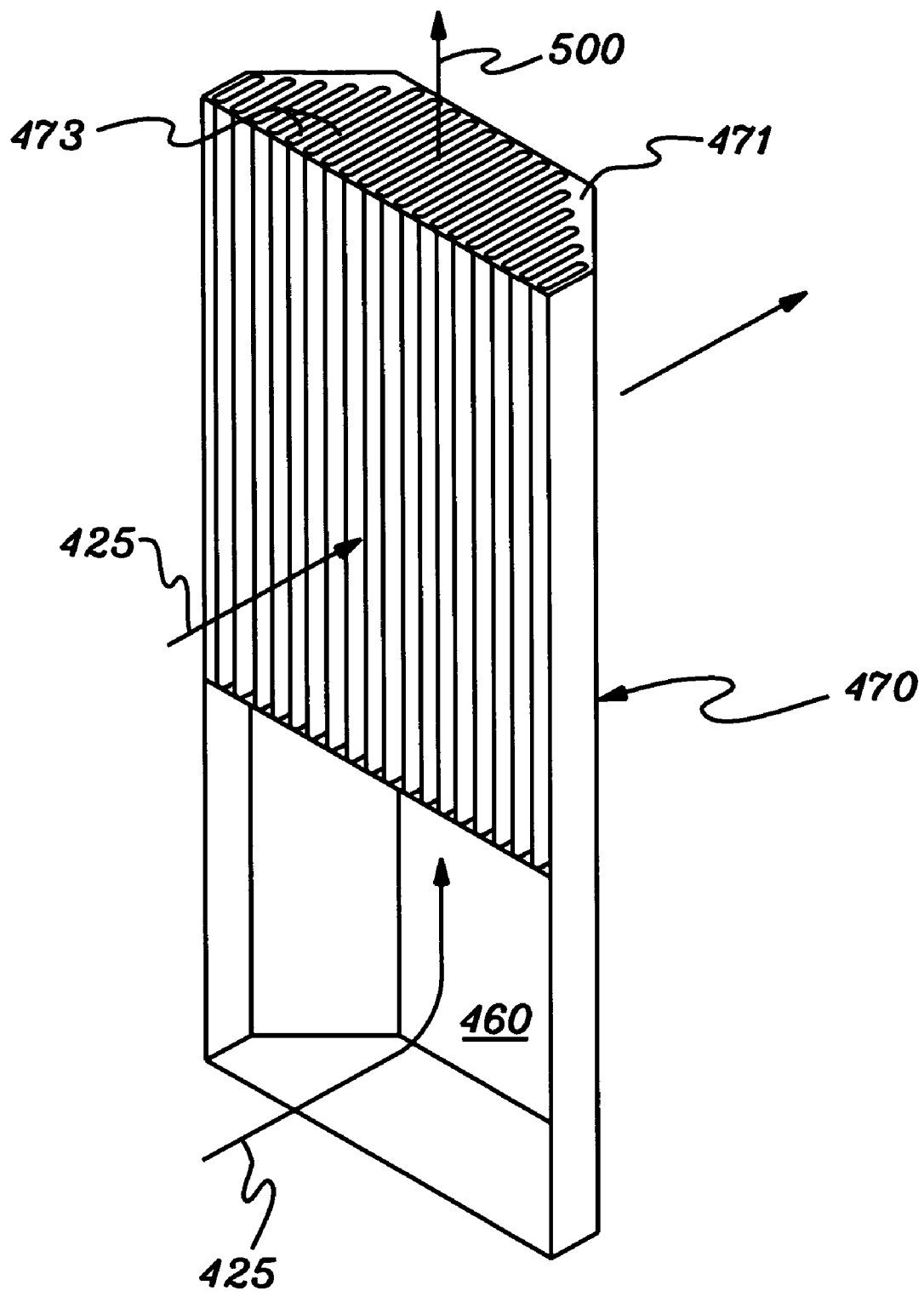
FIG. 5C is an isometric view of the outlet door of FIGS. 5A and 5B, showing air flow patterns through the outlet door from a lower portion and an upper portion of an electronics rack, in accordance with an aspect of the present invention.

FIGS. 5A, 5B, & 5C depict more detailed isometric views of one embodiment of an outlet door 450 configured to facilitate mixing of cooler air with re-circulating air flow, in accordance with an aspect of the present invention. As shown, door 450 includes first section 460 and second section 470, which in this embodiment, correspond to a lower section and an upper section, respectively. First section 460 is substantially enclosed as shown in FIG. 5B, with the exception of an opening at the air outlet side of the electronics rack and the openings to channels 473, which extend the length of second section 470 to an upper surface 471 thereof. Although not shown in the isometric views, an opening can be provided in a bottom surface 462 (FIG. 5B) of the outlet door to align over a corresponding opening in a raised floor to facilitate the introduction of a cool air flow from a cool air supply plenum as illustrated in FIG. 4. This would further reduce the temperature of the re-directed air flow exiting the upper surface 471 of the outlet door, and thereby further enhance lowering temperature of the re-circulating air flow at the air inlet side of the rack. FIG. 5C depicts the orthogonal bidirectional nature of the air flow through second section 470 of the outlet door. As shown, inlet-to-outlet air flow 425 in a lower portion of the electronics rack is re-directed by first section 460 into channels 473 of the second section 470 of the outlet door. This re-directed vertical air flow is thus orthogonal to the horizontal inlet-to-outlet air flow 425 exiting the electronics rack from the upper portion thereof. Further, the re-directed air flow 500 exiting from the top surface of the outlet door is substantially perpendicular to the re-circulating inlet-to-outlet air flow from the upper portion of the electronics rack (as shown in FIG. 4), thereby facilitating mixing of the two air flows.

Figure 6:
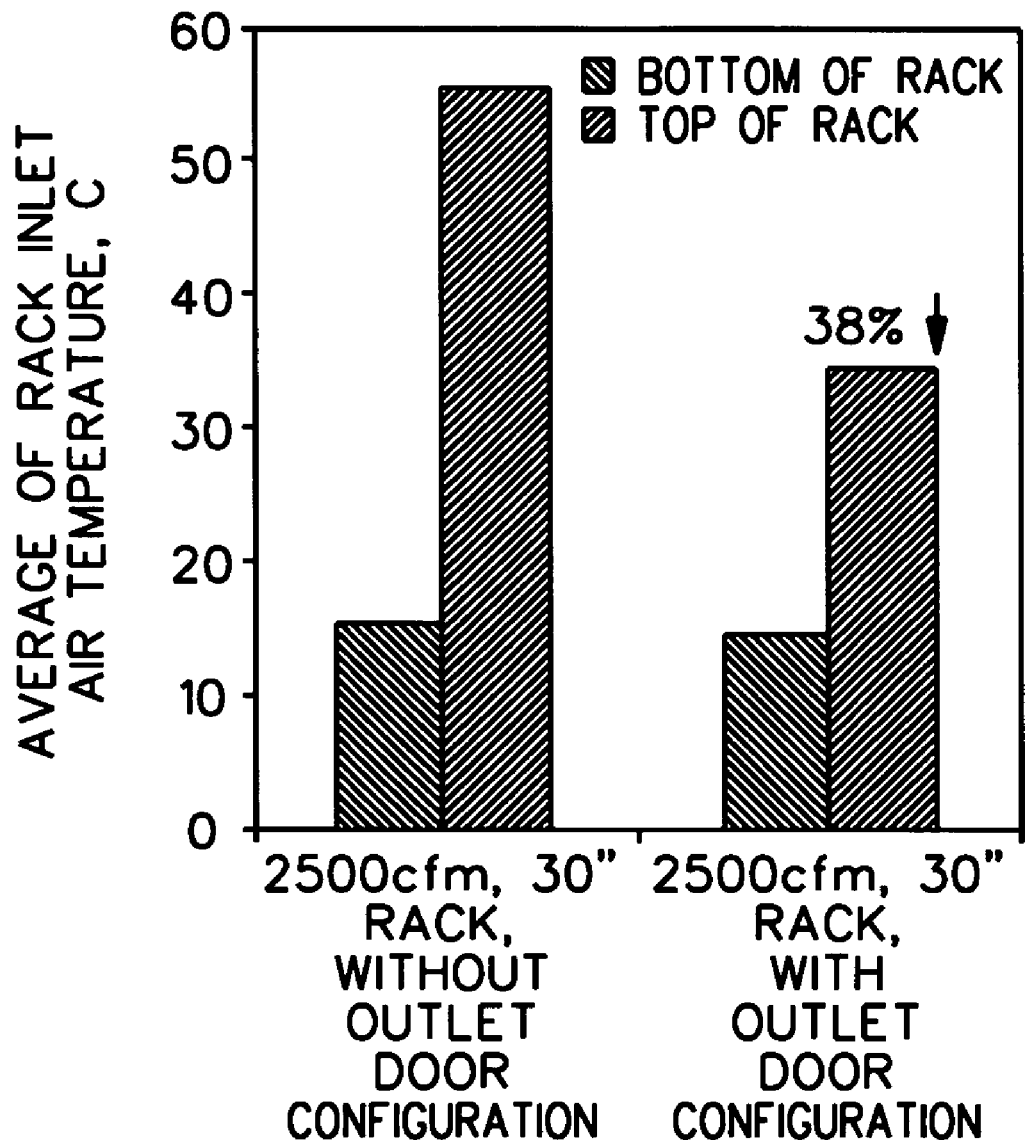
FIG. 6 is a chart of air inlet temperature for lower and upper portions of an electronics rack in a raised floor computer installation, both without re-circulated air flow temperature reduction, and with re-circulated air flow temperature reduction employing an outlet door cover such as the depicted in FIGS. 4-5C, in accordance with an aspect of the present invention.

A representative data center system was modeled using commercially available modeling software, and data generated from this analysis is depicted in FIG. 6. The model employed constituted a quarter symmetry section of a sixteen rack raised floor data center, with each rack unit possessing a 20 kW heat load, and 60% of the rack blower air supply being supplied by other perforated floor tiles in the raised floor (i.e., chilled air at 15° C.). Air flow through the racks was 2500 cfm, and air temperature rise through each rack was assumed to be 15° C. The room layout was arranged in a cold aisle hot isle fashion as depicted in FIG. 1A. The results show a substantial temperature decrease at the upper portion of the air inlet side of the rack of approximately 38 percent when re-directed air flow mixes with re-circulating air flow employing an apparatus such as depicted in FIGS. 4-5C. This is a significant reduction in the maximum rack air inlet temperature, with minimum costs and no computer room installation reconfiguration required.

Figure 7:
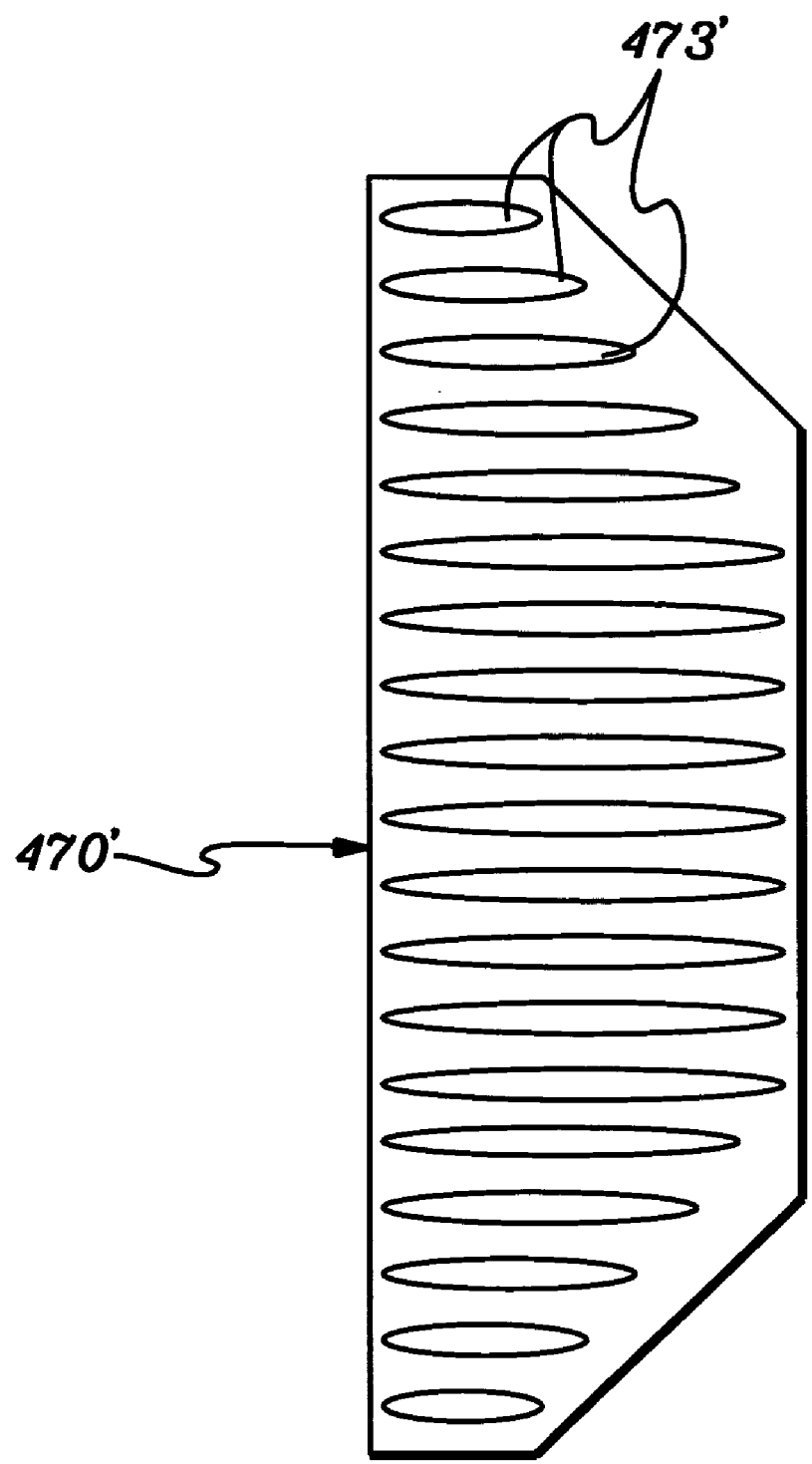
FIG. 7 is a cross-sectional plan view of an alternate embodiment of the outlet door of FIG. 4 taken along line A-A, in accordance with an aspect of the present invention.

Numerous alternate embodiments to an apparatus for facilitating cooling of an electronics rack such as disclosed herein are possible. For example, FIG. 7 depicts an alternate cross-sectional embodiment of the second section of an outlet door such as depicted in FIGS. 4 & 4A. In this embodiment, second section 470' is configured with elliptical shaped channels 473', which may lower pressure drop experienced by the re-directed air flow from the first portion of the electronics rack. Further channel configurations are also possible. For example, tubes of circular cross-section could be employed to move the re-directed air flow from the first section to the upper surface of the second section, or tubes of rectangular-shaped cross-section with elliptical or circular ends, could be employed.

In further alternate embodiments, the apparatus of FIGS. 4 & 4A could be modified so that the hot exhaust inlet-to-outlet air flow from the upper portion of the electronics rack is ducted to force this exhaust air to exit through a lower section of the outlet door. Such a version would require the ducting shown in FIGS. 4 & 4A to be extended to directly receive air flow at the air outlet side of the electronics rack, for example, via 90° angle tubing. Further, similar ducting would be needed to capture the inlet-to-outlet air flow from the upper portion of the electronics rack and re-direct that air flow to the lower section of the outlet door for exhausting. In another embodiment, a configuration such as depicted in FIGS. 4 & 4A could be modified by providing a few openings in the outlet door in the lower section thereof, similar to those in the upper section. This embodiment might be beneficial in balancing air flow requirements and minimizing pressure drop of the re-directed air flow through the channels of the upper section of the outlet door.

In further embodiments, the channels in the outlet door could extend the full length of the door to receive only cooled air supply from the air supply plenum 145 underneath the raised floor, while allowing all inlet-to-outlet air flow through the electronics rack to exhaust out the back of the outlet door. In this embodiment, only cooled air supply is exhausted at the upper surface 471 of the outlet door for mixing with the re-circulating exhaust air in the region above the electronics rack and outlet door as shown in FIG. 4.

Further, those skilled in the art will appreciate that the concepts provided herein are equally applicable to a computer room configuration wherein one or more electronics racks are cooled by a conditioned and cooled air entering the room from overhead ducts and diffusers as shown in FIG. 1B. Within such an environment, an apparatus, such as an outlet door, in accordance with the present invention is configured to move cooler air to the lower portion of the electronics racks to mix with any re-circulating air from the air outlet side of the electronics rack to the air inlet side thereof at the lower portion. In such a configuration, the structures of the first section and second section of the outlet door depicted in FIGS. 4 & 4A could be reversed, with the re-directed air flow exiting the outlet door at a lower region thereof.

Advantageously, the apparatuses and methods disclosed herein are inexpensive, and readily implementable, and are particularly advantageous in a dry data center environment. The apparatuses and methods presented result in a substantial reduction in peak rack inlet air temperature for a moderate to low inlet-to-outlet air flow impedance penalty. Further, the apparatuses disclosed can be readily integrated with a conventional acoustical treatment of an electronics rack.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A cooled electronics system comprising:
    an electronics rack, the electronics rack having:
        an air inlet side and an air outlet side, the air inlet and air outside sides respectively enabling ingress and egress of air;
        at least one electronics drawer;
        at least one air moving device, the at least one air moving device being capable of causing external air to flow from the air inlet side of the electronics rack, across the at least one electronics drawer to the air outlet side of the electronics rack;
    an apparatus coupled to the electronics rack for facilitating cooling the electronics rack, the apparatus comprising:
        an air delivery structure coupled to the electronics rack for delivering air flow at a location external to the electronics rack and in a direction to facilitate mixing thereof with any re-circulating exhausted inlet-to-outlet air flow from the air outlet side of the electronics rack to the air inlet side thereof, wherein the delivered air flow is cooler than the re-circulating exhausted inlet-to-outlet air flow, and wherein mixing of the delivered air flow and the re-circulating air flow facilitates lowering air inlet temperature at a portion of the air inlet side of the electronics rack, thereby enhancing cooling of the electronics rack.

2. The cooled electronics system of claim 1, wherein the apparatus comprises an outlet door, the air delivery structure being part of the outlet door, and wherein the delivered air flow comprises at least one of re-directed inlet-to-outlet air flow through the electronics rack and a cool air supply from external to the electronics rack.

3. The cooled electronics system of claim 2, wherein the outlet door at least partially covers the air outlet side of the electronics rack, and further comprises a first section and a second section, wherein the first section and the second section of the outlet door are configured to re-direct at least a portion of exiting inlet-to-outlet air flow of the electronics rack, and to exhaust the re-directed air flow from the outlet door as the delivered air flow, wherein the re-directed air flow from the outlet door is cooler than the re-circulating air flow.

4. The cooled electronics system of claim 3, wherein at least a portion of exiting inlet-to-outlet air flow of the electronics rack is re-directed by the first section of the outlet door to pass through channels in the second section of the outlet door before being exhausted as re-directed air flow from the outlet door.

5. The cooled electronics system of claim 4, wherein the first section of the outlet door aligns to a lower portion of the electronics rack, and the second section of the outlet door aligns to an upper portion of the electronics rack, and wherein the re-directed air flow in the channels in the second section of the outlet door is substantially orthogonal to exiting inlet-to-outlet air flow through the upper portion of the electronics rack.

6. The apparatus of claim 5, wherein the electronics rack is disposed on a raised floor and cool air supply is provided to the air inlet side of the electronics rack via at least one perforated floor tile of the raised floor, and wherein the re-directed air is exhausted from a top portion of the outlet door in a direction to mix with re-circulating exhausted inlet-to-outlet air flow from the air outlet side of the electronics rack to the air inlet side thereof, wherein exiting inlet-to-outlet air flow through the lower portion of the electronics rack is cooler than exiting inlet-to-outlet air flow through the upper portion of the electronics rack.

7. The cooled electronics system of claim 5, wherein the electronics rack is disposed on a raised floor and a cool air supply is provided to the air inlet side of the electronics rack via at least one perforated floor tile of the raised floor, and wherein cool air supply is also provided to the outlet door through an opening in the outlet door in the first section thereof in air flow communication with a further opening in the raised floor.

8. A method for facilitating cooling of an electronics rack, the method comprising:
    allowing inlet-to-outlet air flow through an electronics rack from an air inlet side to an air outlet side thereof; and
    employing an apparatus coupled to the electronics rack to deliver air flow at a location external to the electronics rack in a direction to facilitate mixing thereof with any re-circulating exhausted inlet-to-outlet air flow from the air outlet side of the electronics rack to the air inlet side thereof, wherein the delivered air flow is cooler than the re-circulating exhausted inlet-to-outlet air flow, and wherein mixing of the delivered air flow and the re-circulating air flow facilitates lowering air inlet temperature at a portion of the air inlet side of the electronics rack, thereby enhancing cooling of the electronics rack.

9. The method of claim 8, further comprising providing the apparatus, wherein the apparatus comprises an outlet door coupled to an air outlet side of the electronics rack, and wherein the delivered air flow comprises at least one of re-directed inlet-to-outlet air flow through the electronics rack and a cool air supply from external to the electronics rack, wherein the delivered air flow passes through at least a portion of the outlet door.

10. The method of claim 9, wherein providing the apparatus further comprises providing the outlet door configured to at least partially cover the air outlet side of the electronics rack, and have a first section and a second section, wherein the first section and the second section of the outlet door are configured to re-direct at least a portion of exiting inlet-to-outlet air flow of the electronics rack, and to exhaust the re-directed air flow from the outlet door as the delivered air flow, wherein the re-directed air flow is cooler than the re-circulating exhausted inlet-to-outlet air flow.

* * * * *

UNITED STATES PATENT AND TRADEMARK OFFICE
CERTIFICATE OF CORRECTION

PATENT NO. : 7,283,358 B2 Page 1 of 1
APPLICATION NO. : 11/184524
DATED : October 16, 2007
INVENTOR(S) : Levi A. Campbell et al.

It is certified that error appears in the above-identified patent and that said Letters Patent is hereby corrected as shown below:

Title Page, Item (75) Inventors:

Delete "Ricahrd C. Chu", and insert --Richard C. Chu--.

Signed and Sealed this

Fourth Day of March, 2008

JON W. DUDAS
*Director of the United States Patent and Trademark Office*